United States Patent
Miller et al.

(10) Patent No.: US 11,940,498 B2
(45) Date of Patent: *Mar. 26, 2024

(54) APPARATUSES AND METHODS FOR PASSIVE FAULT MONITORING OF CURRENT SENSING DEVICES IN PROTECTIVE CIRCUIT INTERRUPTERS

(71) Applicant: Hubbell Incorporated, Shelton, CT (US)

(72) Inventors: Gary Michael Miller, Kearneysville, WV (US); William Vernon Miller, Aldie, VA (US); Edward Shi Chen, Camas, WA (US)

(73) Assignee: Hubbell Incorporated, Shelton, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/141,221

(22) Filed: Apr. 28, 2023

(65) Prior Publication Data
US 2023/0349974 A1    Nov. 2, 2023

Related U.S. Application Data

(63) Continuation of application No. 17/869,537, filed on Jul. 20, 2022, now Pat. No. 11,644,507, which is a
(Continued)

(51) Int. Cl.
*G01R 31/327* (2006.01)
*G01R 35/00* (2006.01)
(Continued)

(52) U.S. Cl.
CPC ......... *G01R 31/3277* (2013.01); *G01R 35/00* (2013.01); *H02H 1/0015* (2013.01);
(Continued)

(58) Field of Classification Search
CPC .......... H02H 1/0015; H02H 3/16; H02H 3/28; H02H 3/331; H02H 3/335; G01R 31/3277; G01R 35/00
(Continued)

(56) References Cited

U.S. PATENT DOCUMENTS

| 5,424,894 A | 6/1995 | Briscall et al. |
| 6,339,525 B1 * | 1/2002 | Neiger ................. H02H 1/0015 361/93.6 |

(Continued)

FOREIGN PATENT DOCUMENTS

| WO | 2010103332 A1 | 9/2010 | |
| WO | WO-2010103332 A1 * | 9/2010 | ........... G01R 22/063 |

OTHER PUBLICATIONS

International Search Report and Written Opinion dated Feb. 4, 2016 which issued in PCT Patent Application No. PCT/US2015/061472.
(Continued)

*Primary Examiner* — Kevin J Comber
(74) *Attorney, Agent, or Firm* — Dickinson Wright PLLC

(57) ABSTRACT

Passive monitoring the integrity of current sensing devices and associated circuitry in GFCI and AFCI protective devices is provided. A protection circuit interrupter employs a capacitively coupled noise signal obtained by an arrangement of one or both of line side arms relative to a Rogowski coil. The noise signal is monitored while the line and load sides of a protective circuit interrupter are disconnected, and the connection of the line and load sides disabled if the noise signal fails to correlate sufficiently to a reference noise cycle. When the line and load sides are connected, the RMS value of the observed current signal is monitored such that the line and load sides are disconnected if the observed current signal fails to meet an RMS threshold. The observed current signal is compensated by subtracting the reference
(Continued)

noise cycle prior to monitoring for the fault condition applicable to the protective device.

11 Claims, 9 Drawing Sheets

Related U.S. Application Data continuation of application No. 16/797,152, filed on Feb. 21, 2020, now Pat. No. 11,408,940, which is a continuation of application No. 15/528,223, filed as application No. PCT/US2015/061472 on Nov. 19, 2015, now Pat. No. 10,591,546.

(60) Provisional application No. 62/084,924, filed on Nov. 26, 2014.

(51) Int. Cl.
| | |
|---|---|
| *H02H 1/00* | (2006.01) |
| *H02H 3/16* | (2006.01) |
| *H02H 3/28* | (2006.01) |
| *H02H 3/33* | (2006.01) |

(52) U.S. Cl.
CPC ............... *H02H 3/16* (2013.01); *H02H 3/28* (2013.01); *H02H 3/331* (2013.01); *H02H 3/335* (2013.01)

(58) Field of Classification Search
USPC .......................................................... 361/42
See application file for complete search history.

(56) References Cited

U.S. PATENT DOCUMENTS

| | | |
|---|---|---|
| 6,470,283 B1 | 10/2002 | Edel |
| 2003/0058596 A1 | 3/2003 | Macbeth |
| 2006/0114627 A1 | 6/2006 | Wong |
| 2011/0216451 A1* | 9/2011 | Haines ............... H02H 3/338 361/93.6 |
| 2011/0249370 A1 | 10/2011 | Nayak et al. |
| 2014/0167740 A1 | 6/2014 | Gilbert |
| 2016/0006234 A1 | 1/2016 | Ostrovsky |
| 2016/0327592 A1 | 11/2016 | Hewson |

OTHER PUBLICATIONS

Supplementary European Search Report dated Jun. 22, 2018, which issued in the counterpart Application No. 15863865.0.

* cited by examiner

APPARATUSES AND METHODS FOR PASSIVE FAULT MONITORING OF CURRENT SENSING DEVICES IN PROTECTIVE CIRCUIT INTERRUPTERS

This application is a continuation of U.S. patent application Ser. No. 17/869,537, filed Jul. 20, 2022, which is a continuation of U.S. patent application Ser. No. 16/797,152, filed Feb. 21, 2020, now U.S. Pat. No. 11,408,940, which is a continuation of U.S. patent application Ser. No. 15/528,223, filed May 19, 2017 now U.S. Pat. No. 10,591,546, which is based on PCT Application No. PCT/US2015/061472, filed Nov. 19, 2015, which claims the benefit of U.S. Provisional Application Ser. No. 62/084,924, filed Nov. 26, 2014, the entire contents of which are incorporated herein by reference.

BACKGROUND OF THE INVENTION

Field of the Invention

The present invention relates to methods and apparatuses that passively monitor the integrity of current sensing devices and associated circuitry in protective circuit interrupters.

Description of Related Art

Arc Fault Circuit Interruption (AFCI) and Ground Fault Circuit Interruption (GFCI) are distinct but equally important technologies that safeguard people and their homes from the shock and fire dangers posed by electrical faults.

Arcing faults are commonly defined as current through ionized gas between two ends of a broken conductor, between two conductors supplying a load, or between a conductor and ground. A number of conditions can cause an arcing fault such as corroded, worn or aged wiring or insulation, a loose connection, wiring damages by a nail or staple in the insulation, and electrical stress from repeated overload conditions or lightning, among other conditions. For example, when electrical components become frayed or damaged, loose parts spark or arc to maintain the current flow, quickly heating the surrounding area. These sparks can ignite nearby wire insulation, causing a fire that can spread quickly. AFCI devices (e.g., AFCI circuit breakers) detect the current fluctuations caused by arc faults and shut down the circuit to prevent electrical wiring fires from arcs.

On the other hand, a ground fault occurs when current flows from a hot conductor to ground through a person or an object. For example, a ground fault can occur when a live or powered circuit contacts ground (e.g., grounded metal such as a screw or wiring box), thereby creating a shock hazard. GFCI receptacles cut off the circuit within milliseconds of this type of fault, preventing stray current from causing harm to a person.

GFCI receptacles or wall boxes are relatively common in dwellings. Arc fault protection has typically been provided by AFCI circuit breakers; however, AFCI receptacles or wall boxes are expected to become more common in dwellings. These GFCI and AFCI devices are designed to meet requirements of a safety standards body such as Underwriters Laboratories or UL requirements UL 943 and UL 1699, respectively.

Typically, protective circuit interrupters employ a magnetically coupled device such as an iron or ferrite core current transformer(s) to sense alternating current (AC) line current. The electrical signal from the sensing device undergoes analog processing such as scaling, filtering, and integration prior to being presented to a supervisory circuit that is responsible for determining the presence of fault conditions on the power distribution circuit being monitored by the protective device. The current sensing device and electronic components that comprise the processing functions, as well as the interconnection thereof, represent potential points of failure that should be monitored in order to assure proper operation of the protective circuit interrupter in compliance with applicable standards body requirements such as UL 1699.

In a ground fault circuit interrupter (hereinafter also referred to as a "GFCI"), the integrity of the current sensing device and associated circuitry is typically evaluated as part of the operator-initiated self-test. During the self-test sequence, the actual fault condition which the GFCI is monitoring for during normal operation, i.e., an imbalance in current flow between the hot and neutral conductors, is safely duplicated by a test circuit within the GFCI. If the GFCI is operating properly, inclusive of the current sensing device and associated circuitry, the fault condition will be detected and the load side of the device will be disconnected from the line side; otherwise, a visual indication of failure of the protective device will be provided via a separate monitor circuit that operates in parallel with the supervisory circuit.

In an arc fault circuit interrupter (hereinafter referred to as a "AFCI"), the fault condition to be detected, that is, the presence of electrical arcing, is difficult at best to duplicate in a safe, reliable, and cost-effective manner within the protective device as part of a self-test function. As a result, standards body requirements such as UL 1699 allow a test circuit to be employed which simulates an arc. More specifically, unlike the condition of current flow imbalance to be detected by the GFCI, the presence of electrical arcing cannot be described by a single concise definition or a single waveform. Instead, arcing appears as a multitude of chaotic phenomena which, in the most general sense, can be described as specific distortions of the observed current waveform. A need therefore exists for improved arc detection in an AFCI device.

Some protective circuit interrupters can undergo a self-test to ensure fault monitoring components are operational but do so only when the line and load sides are connected and by applying a simulated fault condition. A need exists for a protective circuit interrupter that operates passively, that is, performs certain self-test or component integrity check functions even while the load side is disconnected, or while the line and load sides are connected but the load is drawing zero current. In other words, a need exists for a protective circuit interrupter which can ascertain the integrity of the current sensing device, associated analog circuitry and analog to digital converter (ADC) circuitry used to sense and condition an observed signal for fault monitoring without requiring the protective circuit interrupter to be taken out of service.

In addition, a need also exists for improved arc fault detection circuitry that uses minimal space within a receptacle or wall box and meets standards such as UL 1699.

SUMMARY OF THE INVENTION

The above and other problems are overcome, and additional advantages are realized, by illustrative embodiments of the present invention.

In accordance with illustrative embodiments of the present invention, methods and apparatuses are provided to monitor components in a protection device interrupter by:

capacitively coupling at least one of a line hot arm and a line neutral arm in the protection device interrupter to a current sensing coil; analyzing a noise signal created by the capacitively coupling when the line hot arm and a line neutral arm are disconnected, respectively, from a load hot arm and a load neutral of the protection device interrupter to determine reference noise data; monitoring the coil and analog components of the protection device interrupter while the line hot arm and a line neutral arm are disconnected, respectively, from the load hot arm and the load neutral using the noise signal and the reference noise data, the analog components comprising at least one of analog signal conditioning circuitry and an analog to digital input of a digital processor in the protection device interrupter; disabling connection of the line hot arm and the line neutral arm to, respectively, the load hot arm and the load neutral when the noise signal meets a first designated criterion with respect to the reference noise data; analyzing a current signal from the coil when the line hot arm and the line neutral arm are connected, respectively, to the load hot arm and the load neutral; and disconnecting line hot arm and the line neutral arm, respectively, from the load hot arm and the load neutral when the current signal satisfies a second designated criterion with respect to the reference noise data.

In accordance with the foregoing and/or other aspects of illustrative embodiments of the present invention, methods and apparatuses are provided to check for arcing by further subtracting reference noise data comprising a reference noise cycle from the current signal, and checking the signal remaining from the subtracting for arcing when the current signal does not satisfy the second designated criterion.

In accordance with the foregoing and/or other aspects of illustrative embodiments of the present invention, the coil can be, for example a Rogowski coil. Further, the other one of the line hot arm and the line neutral arm is disposed relative to the coil to create current flow in the same direction through each of the line hot arm and the line neutral arm and reinforce the observed current signal.

In accordance with the foregoing and/or other aspects of illustrative embodiments of the present invention, the reference noise cycle is determined by averaging cycles of the noise signal while the line hot arm and the line neutral arm, respectively, are disconnected from the load hot arm and the load neutral and determining a reference noise cycle and a threshold represented by a root mean square value of the reference noise cycle.

In accordance with the foregoing and/or other aspects of illustrative embodiments of the present invention, the second designated criterion corresponds to the threshold, and the disconnecting comprises disconnecting the line hot arm and the line neutral arm, respectively, from the load hot arm and the load neutral when the current signal is less than the threshold or greater than the threshold by a selected amount.

In accordance with the foregoing and/or other aspects of illustrative embodiments of the present invention, monitoring comprises correlating the noise signal with the reference noise cycle, the first designated criterion corresponds to a selected threshold of correlation, and the disabling is performed when the correlating results in correlation below the selected threshold. For example, the selected threshold of correlation is, for example, 0.976.

Additional and/or other aspects and advantages of the present invention will be set forth in the description that follows, or will be apparent from the description, or may be learned by practice of the invention. The present invention may comprise a protective circuit interrupter and methods for forming and operating same having one or more of the above aspects, and/or one or more of the features and combinations thereof. The present invention may comprise one or more of the features and/or combinations of the above aspects as recited, for example, in the attached claims.

BRIEF DESCRIPTION OF THE DRAWINGS

The present invention will be more readily understood with reference to the illustrative embodiments thereof as shown in the attached drawing figures, in which.

Throughout the drawing figures, like reference numbers will be understood to refer to like elements, features and structures.

DETAILED DESCRIPTION OF ILLUSTRATIVE EMBODIMENTS

Figure 1C:
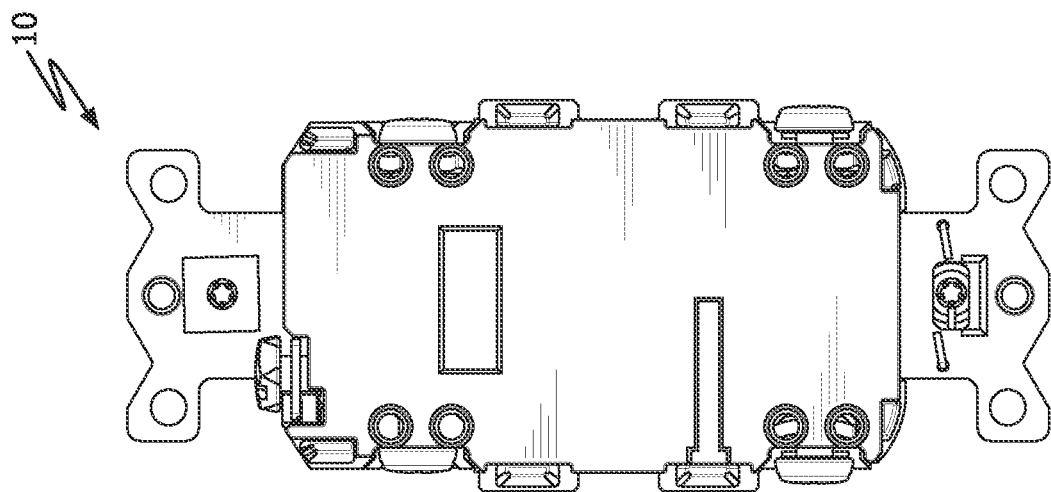
FIGS. 1A, 1B and 1C are, respectively, front, side and back views of a protective circuit interrupter constructed in accordance with an illustrative embodiment of the present invention.

Reference will now be made in detail to embodiments of the present invention, which are illustrated in the accompanying drawings. The embodiments described herein exemplify, but do not limit, the present invention by referring to the drawings. As will be understood by one skilled in the art, terms such as up, down, bottom, and top are relative, and are employed to aid illustration, but are not limiting.

In accordance with illustrative embodiments of the present invention, methods and apparatuses are provided to detect faults. In addition, methods and apparatuses are provided that passively monitor the integrity of current sensing devices and associated circuitry in protective circuit interrupters such as Arc Fault Circuit Interrupters (AFCI) and Ground Fault Circuit Interrupters (GFCI), as well as monitor AC line current to perform fault testing, without taking the protective device out of service.

Figure 1B:
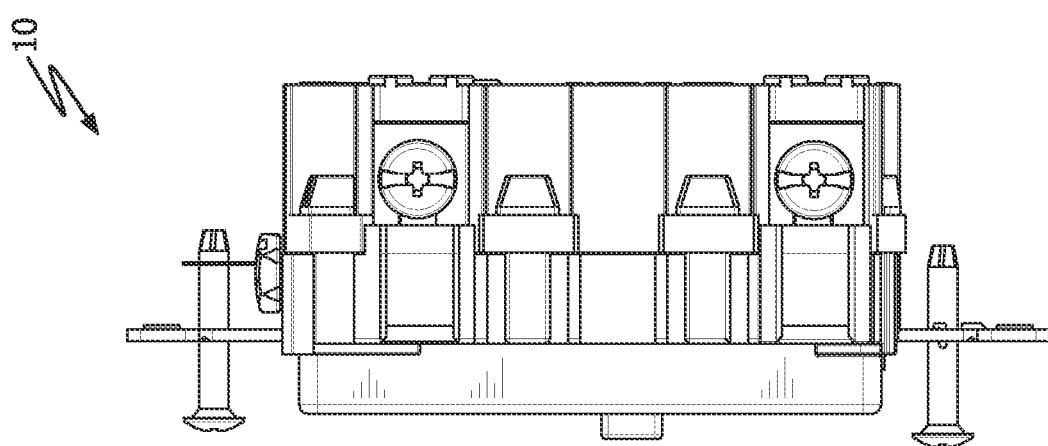
Figure 1A:
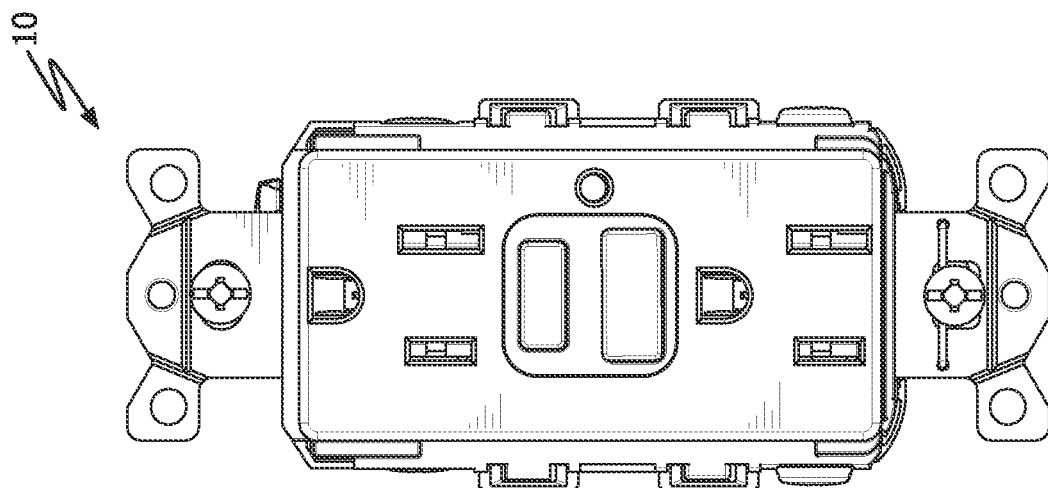
Figure 2:
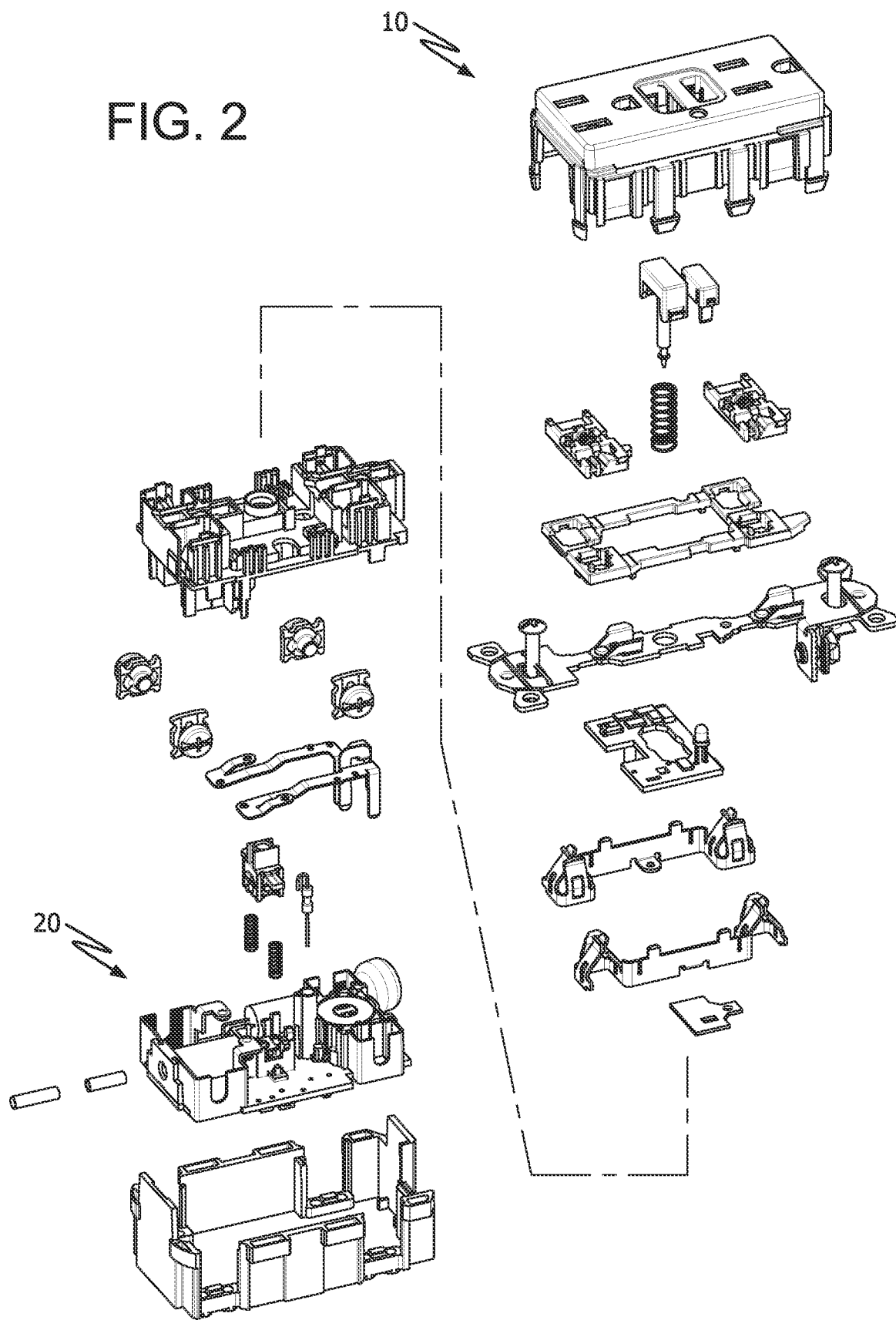
FIG. 2 is an exploded view of the protective circuit interrupter of FIG. 1.

An example protective circuit interrupter 10 constructed in accordance with an illustrative embodiment of the present invention is shown in FIGS. 1A, 1B, 1C, 2 and 3. As shown in FIGS. 1A through 1C, the protective circuit interrupter 10 has a face plate with two three-prong outlets (i.e., each having phase, neutral and ground openings), openings for accommodating TEST and RESET buttons, and grounding yoke assembly with mounting ears, and is dimensioned to be fastened into a standard wall box or receptacle. FIG. 2 shows an exploded view of the components between the face place and bottom housing including button assemblies, mounting components, spacers and a core assembly indicated generally at 20. The mechanical paths of the TEST and RESET buttons, and the electrical paths of the outlet sockets with connected load(s) from the face plate to a control board indicated 30 that is part of a core assembly 20, can be configured in a conventional manner as with commercial GFCI or AFCI products designed for installation in a standard wall box, for example. The core assembly 20 and control board 30, however, are configured in accordance a number of advantageous aspects of the present invention described herein.

Figure 3:
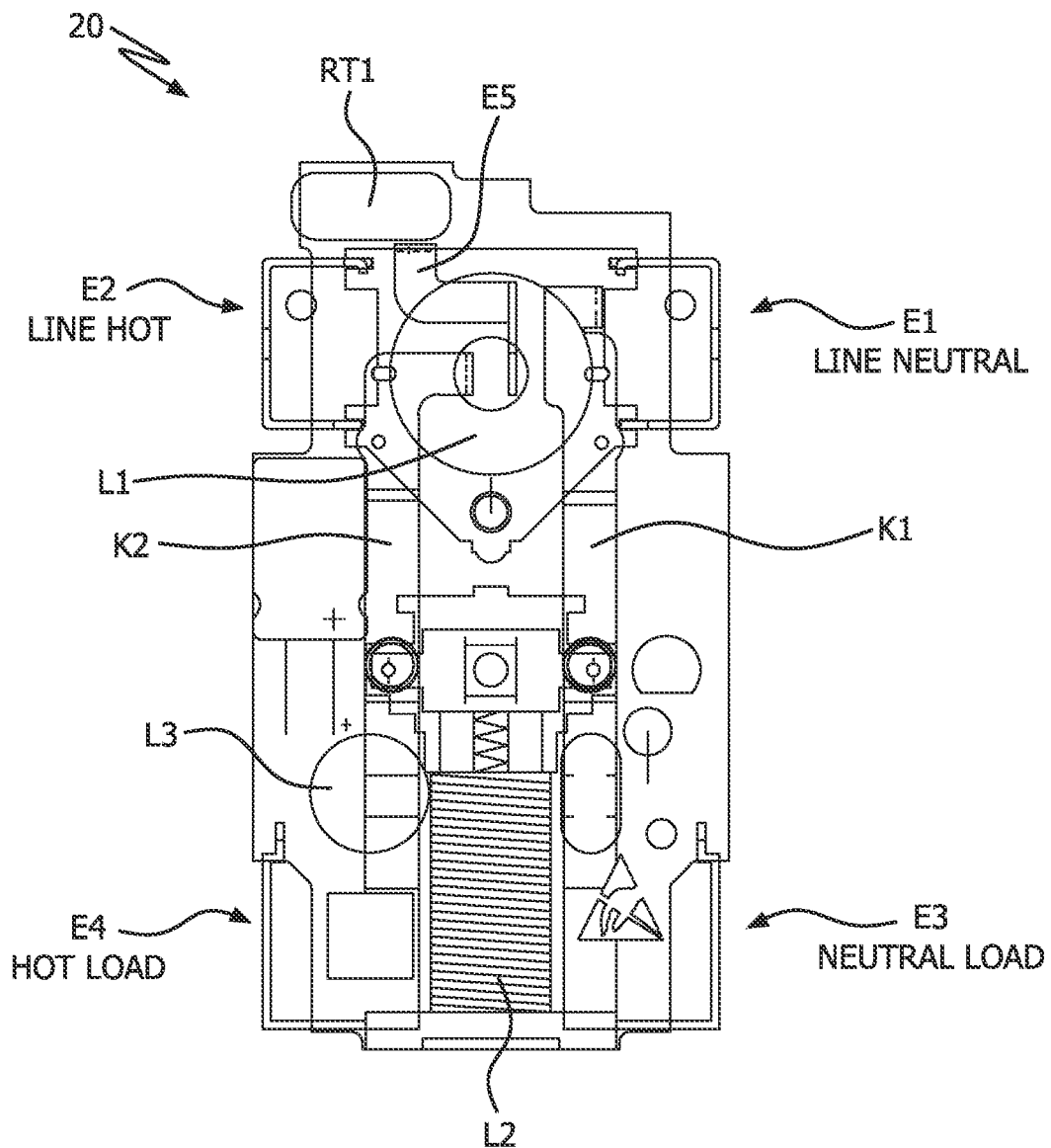
FIG. 3 is a top view of a core assembly provided in a protective circuit interrupter and constructed in accordance with an illustrative embodiment of the present invention.
Figure 4A:
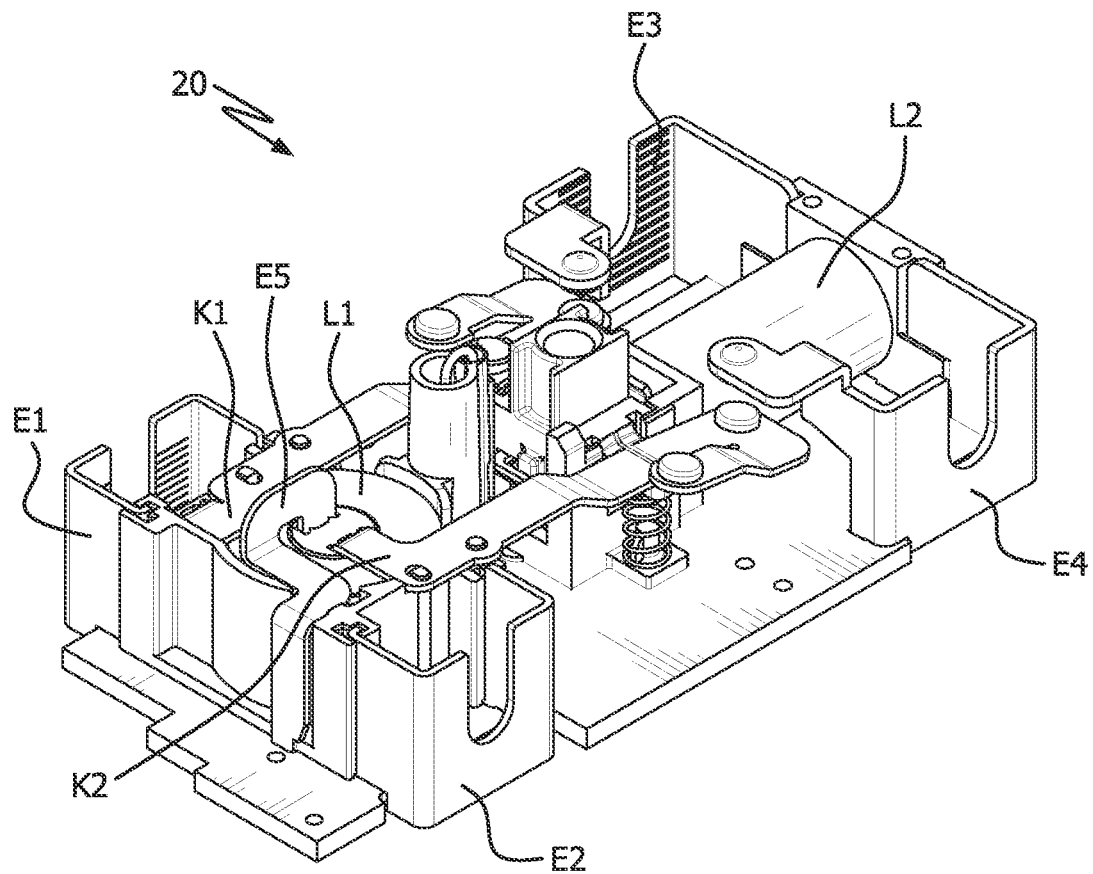
FIG. 4A is an isometric view of the core assembly of FIG. 3.
Figure 4B:
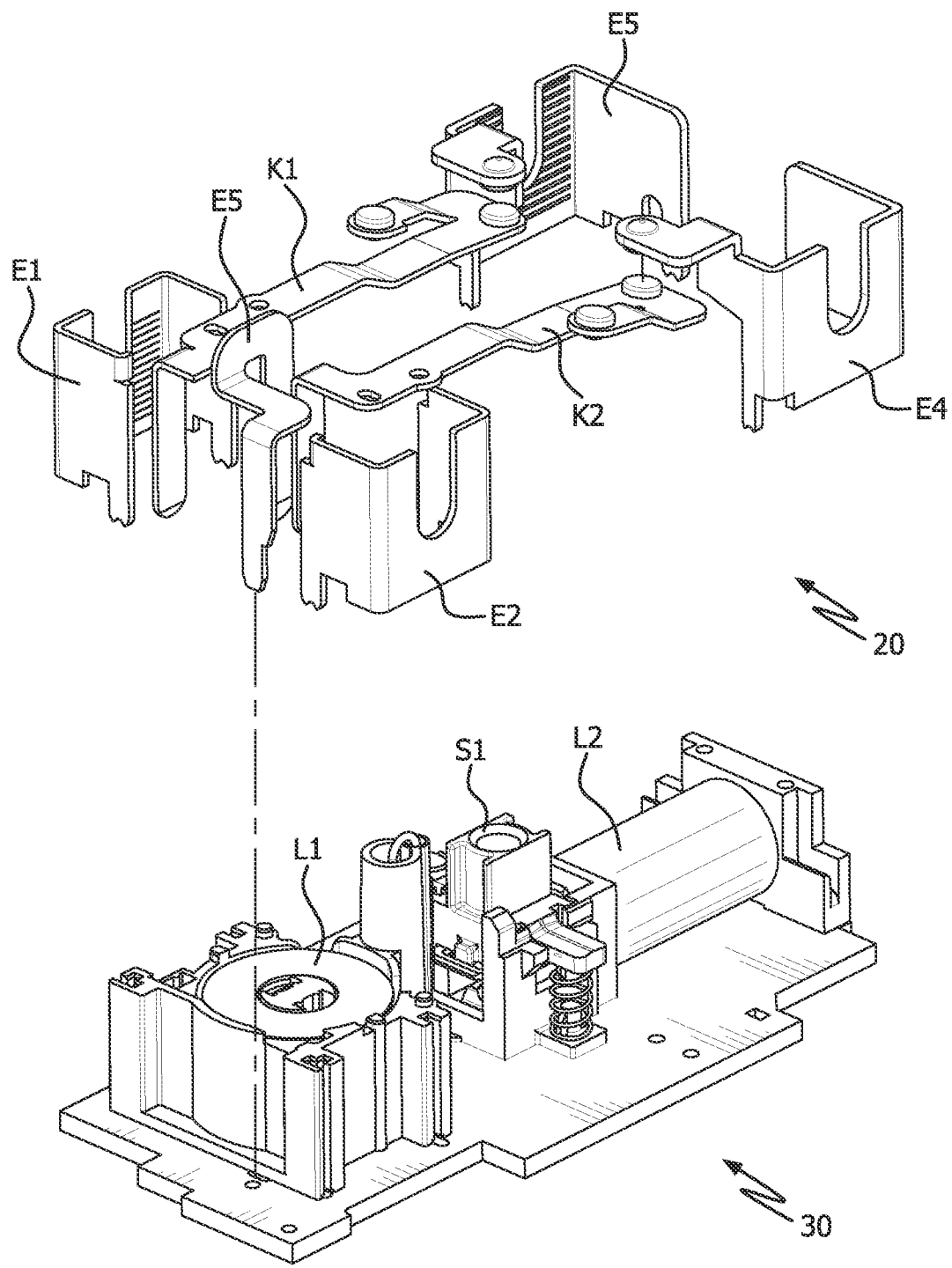
FIG. 4B is an exploded view of core assembly of FIG. 4A.
Figure 4C:
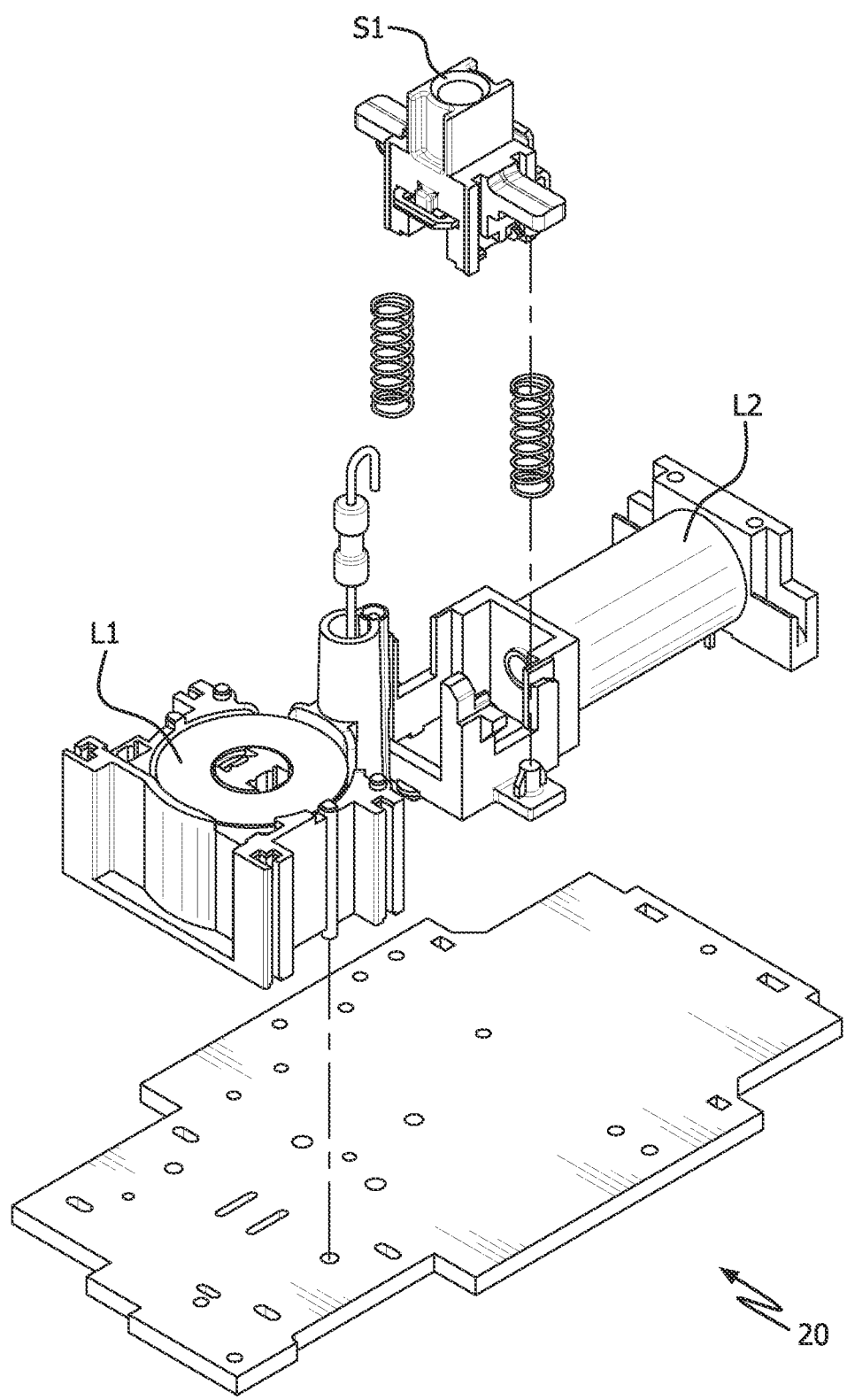
FIG. 4C is an partial exploded view of the core assembly of FIG. 4B with some components in FIG. 4B omitted for clarity.
Figure 5:
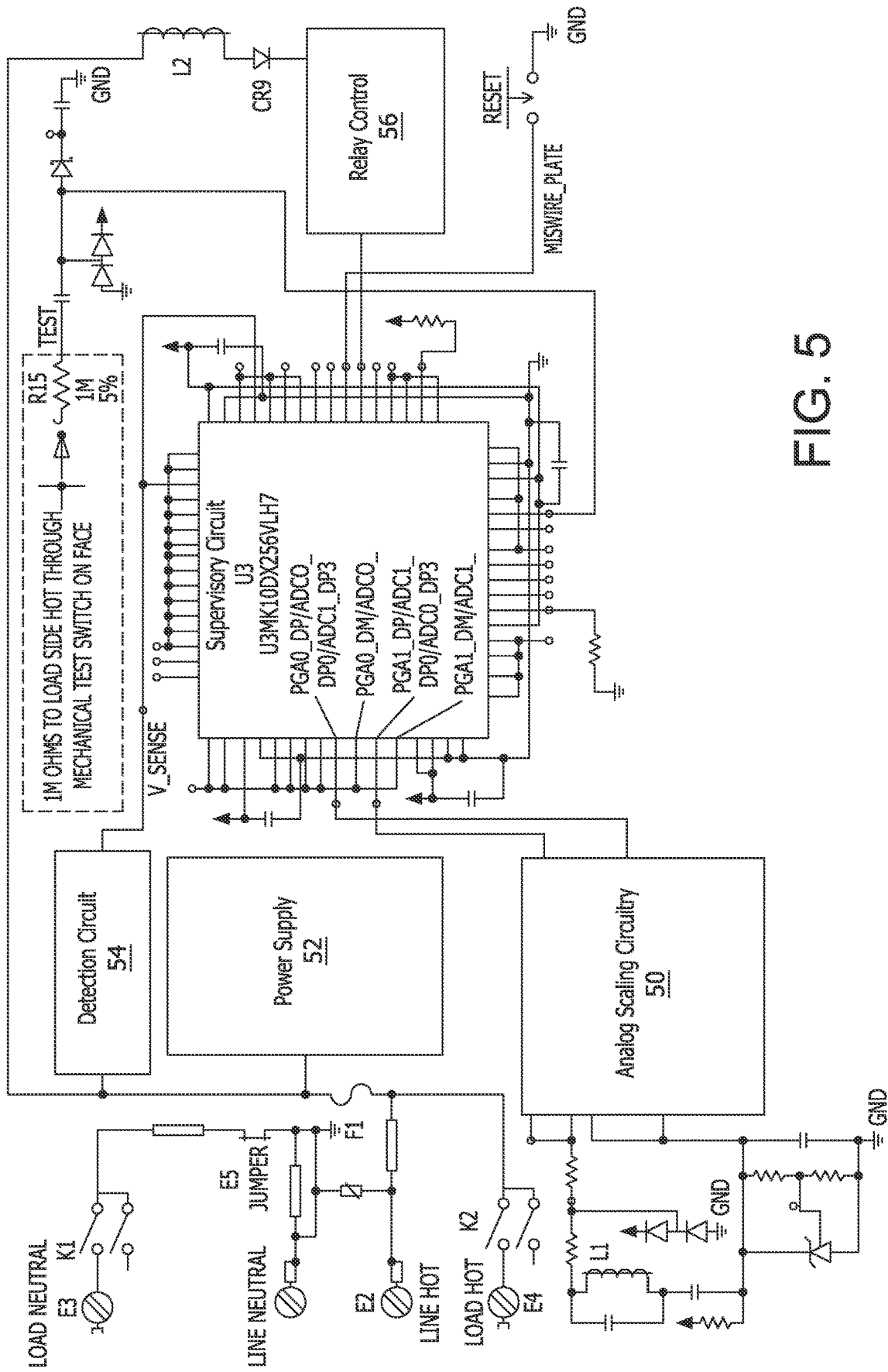
FIG. 5 is a schematic diagram of electrical components provided on the fault monitoring and circuit interrupter board of FIG. 3 and constructed in accordance with an illustrative embodiment of the present invention.

In accordance with an illustrative embodiment of the present invention, the core assembly 20 comprises a printed circuit board 30 having the electronic components shown in the schematic diagram of FIG. 5, and various other components depicted in FIGS. 3, 4A, 4B and 4C. Some components have been omitted for clarity. For example, a current sensing coil L1 and solenoid L2 and contacts K1 and K2 for the control relay are shown.

With reference to FIGS. 4A, 4B and 4C, the core assembly 20 comprises a current sensing coil L1 such as, for example, a Rogowski coil instead of an iron or ferrite-type toroid that is more commonly used in many existing protective circuit interrupters, and an advantageous arrangement of the line hot arm K2 and the line neutral arm K1 with respect to the coil L1. As shown in the schematic of FIG. 5, the signal ground reference is from the line neutral lead as opposed to the line hot lead. Also as shown in the schematic of FIG. 5 and the core assembly 20 of FIG. 3, current flow through Rogowski coil L1 is sensed on both the hot and neutral leads via brush K2 and jumper E5 respectively, making the protective circuit interrupter 10 useful in older dwellings which lack an earth ground. The Rogowski coil L1 is an advantageous type of coil since it requires less room in the protective circuit interrupter 10 and therefore in a wall box than larger iron or ferrite core current transformer-type sensing coils. Although the Rogowski coil L1 can be more susceptible to noise than iron or ferrite-type toroids, the protective circuit interrupter 10 uses noise advantageously to monitor for faults and the integrity of the current sensing device (e.g., L1) and associated analog circuitry and analog to digital conversion (ADC) circuitry. More specifically, protective circuit interrupter 10 uses noise advantageously to monitor for faults passively, that is, even while the line and load sides of the protective circuit interrupter 10 are disconnected in accordance with an illustrative embodiment of the present invention. Also, both the line hot and the line neutral paths are monitored for faults.

With continued reference to FIGS. 3, 4A, 4B and 4C, background noise is capacitively coupled to the Rogowski coil L1 as a test signal in accordance with an illustrative embodiment of the present invention and described in further detail below. For example, the capacitive coupling can be achieved by the overlapping of a portion (hereinafter referred to as the brush) of the line hot arm K2 with the coil L1, as shown in FIGS. 3, 4A and 4B. In addition, the line neutral arm K1 is provided with a jumper E5 (e.g., an extension constructed of electrically conductive material) that is placed relative to the line hot arm K2 and the coil L1 such that the routing of the line hot and neutral leads through the coil causes current flow through both to be in the same direction, resulting in the reinforcement of the observed current signal and the electromagnetic field created by the current flow that is sensed by the coil L1 and therefore an improved signal-to-noise ratio that provides an enhanced ability to perform arc detection. It is also noted that the capacitively coupled noise is present at all times, such that the analog signal output of the Rogowski coil L1 is a composite of both the capacitively coupled noise and a signal proportional to the sensed line-current passing through the coil via the line hot and neutral leads. As such, an average cycle representative of the capacitvely coupled noise is determined under no-current flow conditions when relay contacts K1 and K2 are open, and is subsequently subtracted from the composite signal by the supervisory circuit U3 in the protective circuit interrupter 10. By this method, the supervisory circuit U3 is able to both process a true representation of the sensed line-current, and passively monitor the integrity of the analog processing circuitry inclusive of the Rogowski coil L1 and analog-to-digital converters.

Since the arc condition to be detected is complex, a test circuit which consistently and accurately simulates arc faults is provided that is implemented in software in accordance with an aspect of the present invention. With reference FIG. 5, a supervisory circuit U3 in the protective circuit interrupter 10 comprises an analog-to-digital converter (ADC) and a digital signal processor (DSP) or microprocessor equivalent. The ADC and DSP can be provided combined in an integrated circuit U3, or implemented as separate circuits. The ADC in the supervisory circuit U3 receives a telemetry signal representing the AC line-current from a current sensing device (e.g., coil L1) and associated analog processing circuitry described below, and converts it to a stream of digital data samples for processing by the DSP in supervisory circuit U3.

Under normal operating conditions, the DSP in supervisory circuit U3 analyzes the digital AC line current data in order to identify the presence of electrical arcing. During an operator-initiated self-test, the DSP substitutes the data stream received via the ADC with pre-recorded data taken while electrical arcing is known to be present (e.g., stored arcing data in a memory of the supervisory circuit chip U3 or a peripheral memory device). If the remainder of the supervisory circuit U3 is operating properly, the presence of arcing will be detected, and the load side of the protective circuit interrupter 10 will be disconnected from the line side. As with a GFCI, a visual indication of failure of the protective device can be provided via a separate monitor circuit that operates in parallel with the supervisory circuit U3. Since the data from the ADC was bypassed in the supervisory circuit U3, it is also necessary to separately monitor the ADC, as well as the current sensing device (e.g., coil L1) and associated analog circuitry (e.g., an analog processing circuit disposed between the coil and the supervisory circuit U3). If any of these components are found to be defective at any time, the load side of the protective circuit interrupter 10 is to be immediately disconnected from the line-side (e.g., the RESET button is disabled).

In accordance with an advantageous aspect of illustrative embodiments of the present invention, a passive method is used for monitoring the integrity of the current sensing device and associated circuitry, including the ADC, which is described with reference to FIG. 7. The supervisory circuit U3 can be programmed or otherwise configured to implement the passive method, along with other circuit integrity testing operations and fault monitoring operations, the details of which are omitted here for conciseness.

The electronic components on the printed circuit board 30 of the core assembly 20 will be described with reference to FIG. 5. A power source (e.g., a 120 V AC power source) can be connected to the line side terminals E1 and E2 to provide power to the load when the relay coil L2 is operated to close contacts between the line side neutral and hot leads K1 and K2 and corresponding load side terminals E3 and E4. As described above, the line hot arm K2 and coil L1 create capacitive coupling that is evaluated when the relay contacts are open using analog scaling circuitry 50 and a processor such as the supervisory circuit U3. The line hot path comprises a fuse μl, power supply 52, and detection circuit 54 for sensing line hot lead voltage and zero-crossing and scaling a 120 V sinusoid, for example, to a 0-3 V square wave. The detection circuit has interrupted and uninterrupted inputs to the supervisory circuit U3. One of these inputs is provided so that the DSP or embedded microcontroller in the supervisory circuit U3 can 1) determine if a zero-crossing exists and (2) determine whether the zero-crossing makes sense, that is, is occurring in a sampled part of cycle where it is expected to occur based on detected samples of the input signal. This is beneficial, for example, when the load is a light dimmer. Thyristors in loads such as light dimmers can create a glitch when activated that is mistaken for a zero-crossing. The DSP or embedded microcontroller in the supervisory circuit U3 can be programmed or otherwise configured to determine if a sensed zero-crossing is a legitimate zero-crossing associated with the line signal.

With continued reference to FIG. 5, the printed circuit board 30 of the core assembly 20 comprises a relay control circuit 56. When the supervisory circuit U3 detects an arc, it generates a pulse output to an SCR gate in the relay control circuit to operate L2 and controllably open relay contacts K1 and K2. As stated above, the sensing coil L1 is a Rogowski coil with processing circuitry for analog input to two analog to digital converters (ADC) inputs in the supervisory circuit U3. The analog processing circuit has low current (LC) and high current (HC) analog conditioning components since both LC and HC sensing is performed by the protective circuit interrupter 10. UL safety standards require tests where a conductor is shorted. HC sensing is needed since the source for a fuse panel is 500 amps, for example. LC sensing, however, is needed for the normal operating range of load (e.g., 15-30 amps), as well as parallel processing and scaling of 500 amps for UL testing. The ADC of the supervisory circuit U3 in the protective circuit interrupter 10, therefore, is configured to accommodate a wide dynamic range.

Figure 7:
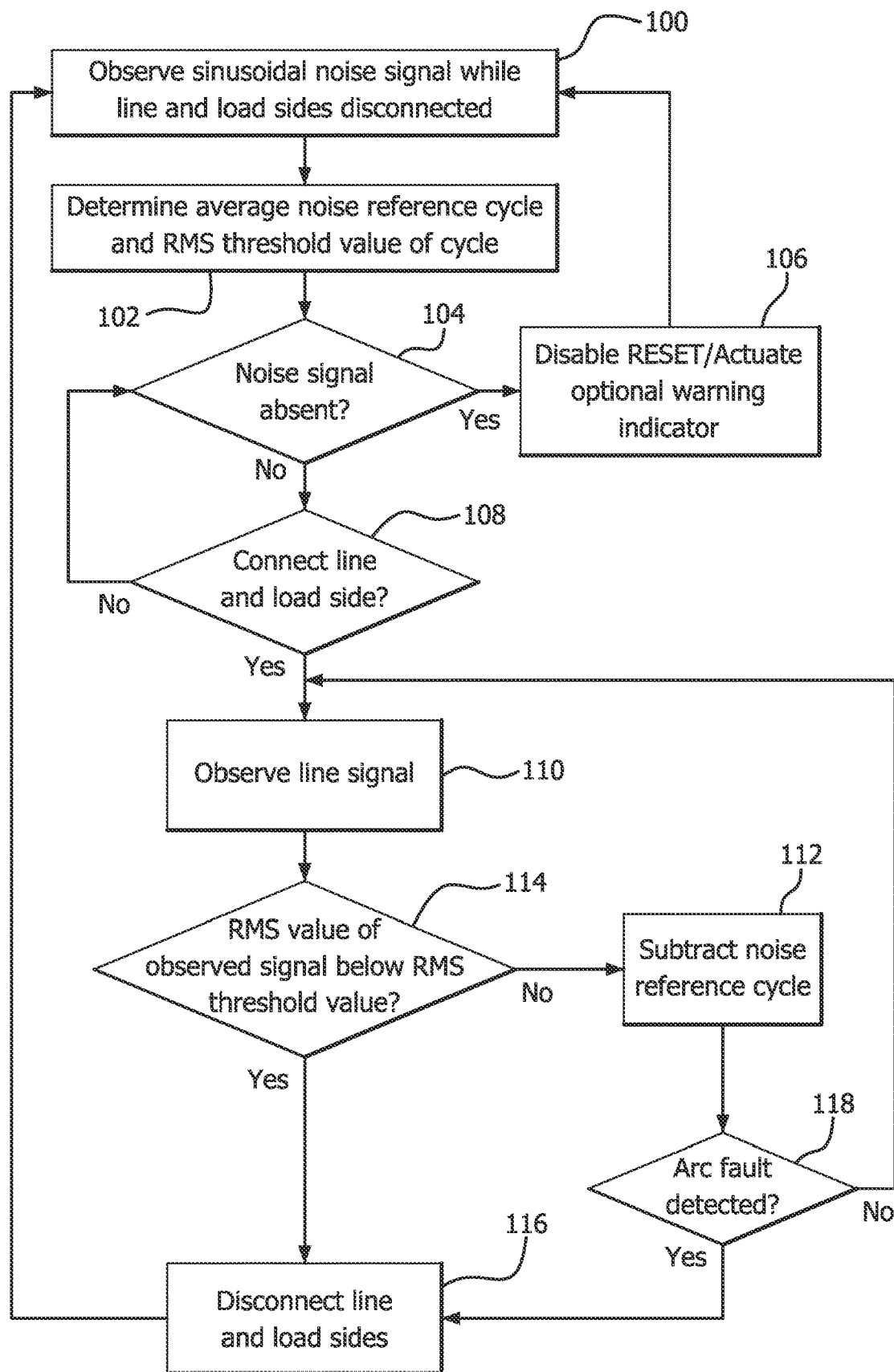
FIG. 7 is a flow chart of illustrative operations of a protective circuit interrupter constructed in accordance with an illustrative embodiment of the present invention.

With reference to block 100 in FIG. 7, under no-load conditions, no current is drawn through the current sensing device (e.g., the coil L1) and ideally the output of the ADC in the supervisory circuit U3 would represent a continuous 0-Amp level. However, as mentioned above, capacitive coupling between an unshielded current sensing device L1 and nearby conductors (e.g., K2) can result in a non-zero amplitude sinusoidal "noise" signal appearing at the ADC output, even though no current is being drawn through the sensing device L1. Such an effect can be observed with the physical arrangement of the Rogowski coil current sensor (L1), the sensed line side hot lead brush (K2) and the line-side neutral lead extension or brush (K1) shown in FIGS. 4A and 4B. A Rogowski coil is advantageous because a sense coil with an iron or ferrite core will be a low impedance device that is not as susceptible to the capacitive coupling.

Figure 6:
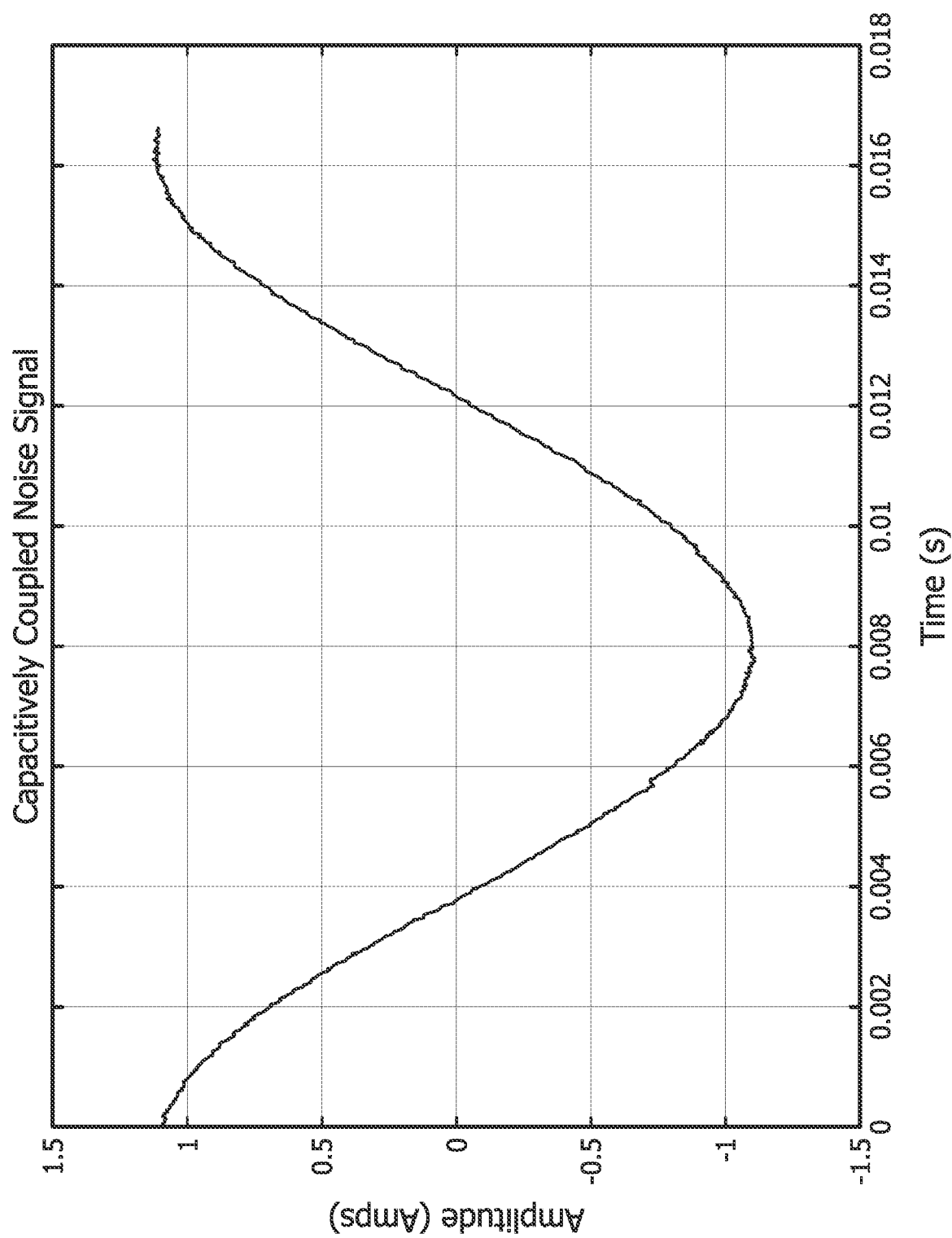
FIG. 6 is a diagram of a capacitively coupled sinusoidal noise signal employed by the fault monitoring and circuit interrupter board of FIG. 3 and constructed in accordance with an illustrative embodiment of the present invention.

With reference to block 102 in FIG. 7, an average noise reference cycle and a root mean square (RMS) threshold value of the cycle are determined by the supervisory circuit U3. With no current drawn through the hot lead brush (K2), the capacitively coupled sinusoidal noise signal shown in FIG. 6 can be observed at the output of the ADC. Both the phase and amplitude of the noise signal exemplified in FIG. 6 can vary from unit-to-unit as the result of component tolerances, and vary from application-to-application as the result of environmental differences (e.g., installation in a metal conduit box versus a plastic one). For illustrative purposes, only a single typical cycle at 60-Hz is shown in FIG. 6, and the scaled amplitude of the observed noise signal is 780-mArms in this particular instance. The waveform in FIG. 6 is the expected wave shape of a single cycle and is stored in memory as a noise reference cycle to provide the supervisory circuit U3 with a reference waveform representative of the expected noise. Once determined, the supervisory circuit U3 is programmed or otherwise configured to use the RMS value of the noise reference cycle to set a threshold (e.g., 1-Arms+/−25%) that is used for integrity monitoring of the current sensing device and associated circuitry while the load and line sides are disconnected. Note that when the load and line sides are connected, the observed RMS current amplitude should always appear to be greater than 750-mArms due to the presence of the capacitively coupled noise even when there is no load-current present.

With reference to block 104 in FIG. 7, the supervisory circuit U3 passively monitors the integrity of the current sensing device L1, the associated analog circuitry (e.g., the analog scaling circuitry in FIG. 5) and the ADC in U3 by determining if an extended absence of the sinusoidal noise signal occurs while the line and load sides are disconnected (i.e., satisfies a first criterion). For example, an extended absence can be implied or indicated when, after collecting 25-cycles worth of data, the computed average is correlated against the expected wave shape and fails to meet the minimum threshold requirement of 0.976. For such a determination, for example, the supervisory circuit U3 is programmed or otherwise configured to correlate an observed noise signal with the expected wave shape (i.e., the noise reference cycle exemplified in FIG. 6 that is stored in memory) while the line and load sides are disconnected. The supervisory circuit U3 obtains an observed noise signal by determining an average cycle of current representative of the capacitive coupled noise present at its LC A/D converter input while the relay contacts are open. A default zero-crossing offset value of 58 is used, and 25-cycles worth of data are collected from which an average cycle representative of the noise is calculated and stored for the LC A/D input for correlation against the reference waveform representative of the expected noise (e.g., FIG. 6). If the result of the correlation meets or exceeds a threshold of 0.976, the Rogowski coil L1 and associated analog circuitry are considered to be working properly and the RESET button is enabled; otherwise, the RESET button is disabled such that subsequent pressing of the RESET button will not result in latching of the relay contacts, as indicated at block 106. The magnitude of the signal presented to the low-current sense A/D input is approximately 16.943 times that of the signal as presented to the high-current sense input. This makes correlation measurements of the capacitively coupled noise signal unreliable as full-scale on the high-current input is about 500-Arms and the noise signal is expected to be about 1-Arms+/−25%. The high-current A/D input is validated by comparing the RMS value calculated for a sampled signal to the RMS value calculated for the same signal sampled on the low-current A/D input. If the RMS value produced by the high-current A/D input is not within +/−10% of the RMS value produced by the low-current A/D input, the high-current analog circuitry is determined to be faulty and the U3 supervisory circuit will disconnect the load-side from the line-side.

In accordance beneficial aspects of illustrative embodiments of the present invention and with reference to blocks 108 and 110 of FIG. 7, the integrity of the current sensing device (e.g., coil L1), associated analog circuitry (e.g., analog scaling circuitry disposed between the coil and the supervisory circuit U3), and the ADC in the supervisory circuit U3 are passively verified by (1) monitoring for an extended absence of a sinusoidal signal (e.g., the observed noise signal described above), and (2) monitoring the RMS value of the observed signal in order to determine if it falls outside of a range set by the observed noise signal specific to the unit (e.g., due to variances in components in the protective circuit interrupter 10 and its particular deployment such type of wall box). As described above, the first condition (1) is most reliably checked by the supervisory circuit U3 measuring the degree of correlating between the observed noise signal and the expected wave shape of a single cycle (e.g. the waveform shown in FIG. 6) while the load and line sides of the protective device are disconnected. The second condition (2) is checked (e.g., during an operator-initiated reset function) while the load and line sides are connected. With reference to blocks 110 and 112 in FIG. 7, the supervisory circuit U3 is programmed or otherwise configured to observe the line signal and subtract the noise reference cycle.

The protective circuit interrupter 10 is advantageous because it accounts for the presence of the observed background noise to assure proper operation of the protection device. More specifically, the presence of the noise signal can interfere with the detection of electrical arcing by the supervisory circuit U3, particularly when the current drawn by the load is close to or less than the RMS value of the capacitively coupled noise signal. For this reason, the effects of the noise are compensated for by analyzing the observed current on a cycle-by-cycle basis and subtracting the noise reference cycle, which represents the expected capacitively coupled noise specific to the unit and its application, prior to checking for the presence of arcing in the observed data.

With reference to block 114 in FIG. 7, if the second condition is met (e.g., the RMS value of the observed signal drops significantly below that of the observed noise signal specific to the unit and application and stored as an RMS threshold), the load side of the protective circuit interrupter 10 is immediately disconnected from the line side as shown in block 116, and the first condition is checked for as shown in block 100. The load side is not to be reconnected to the line side so long as the first condition is met while the load and line sides are disconnected. While the load and line sides are disconnected, if the observed noise signal is found to be sufficiently correlated to the expected wave shape, a new RMS threshold range is determined (e.g., recalculate the noise reference waveform) for evaluating the second condition, and the load side is then permitted to be reconnected to the line side during a subsequent operator-initiated reset function. Newly determined RMS threshold ranges are not likely to change significantly. Indeed, a fixed range of 1-Arms+/−25% is expected to be sufficient for the purposes of fault evaluation. If the second condition is not met, then the observed signal is evaluated for arcing. For example, the DSP in the supervisory circuit U3 can analyze digital line current data to identify the presence of electrical arcing by comparing that data to stored, pre-recorded data or processing using parameters representative of expected distortions in a current waveform related to arcing. The analyzed data can be substituted data representative of arcing that is used during a self-test. With continued reference to block 114 in FIG. 7, if the second condition is not met, then reference noise data comprising a reference noise cycle is subtracted from the current signal (block 112), and the signal remaining from the subtracting is checked for arcing (block 118).

As described herein, the protective circuit interrupter 10 is advantageous because it accounts for component tolerance variations that affect the observed background noise on a unit-to-unit basis, it accounts for environmental variations that affect the observed background noise on an application-to-application installation basis (e.g., recalculates the noise reference waveform after disconnection of line and load sides when the second condition is met), and also accounts for the presence of the observed background noise to assure proper operation of the protection device. Further, the capacitively coupled noise signal employed by protective circuit interrupter 10 is advantageous because it is generally present and observable at all times while the load side of the protective circuit interrupter 10 is disconnected from the line side such as, for example, during installation of protective circuit interrupter 10, following successful execution of an operator initiated self-test, and during a tripped condition following the detection of a fault condition in the line current. Also, under normal operating conditions in which the load and line sides are connected, this signal is generally present and observable at all times during which no current is being drawn by the load. More specifically, under all operating conditions, there should never be an extended time during which a sinusoidal signal is absent, or the RMS value of the observed signal (e.g., the telemetry signal from coil L1) drops significantly below that of the observed noise signal specific to the unit and its application (fixed lower limit of 750-mArms), nor should the observed signal become excessively large (fixed upper limit of 1.25-Arms when relay contacts are open).

The apparatuses and methods described herein are illustrative embodiments of the invention that allow (a) standards body test functionality requirements, such as UL1699, to be met in a cost-effective manner, (b) do not require the protective device to be taken out of service for component integrity evaluation, (c) continuously monitor the current sensing device and associated circuitry and immediately disconnect the load-side from the line-side if failure of any of these components is detected, (d) employ the use of background noise capacitively coupled into the current sensing device as a test signal, and (e) use a Rogowski coil as the current sensing device in order to provide enhanced susceptibility to capacitive coupling of the test signal relative to that of iron or ferrite core current-transformer type sensing coils.

In accordance with another aspect of illustrative embodiments of the present invention, a manufacturing test procedure is provided for the protective circuit interrupter 10 which further exemplifies accounting for component tolerance variations unit by unit, and employing a capacitively coupled noise signal for passively evaluating analog front-end circuitry such as the current sensing device (e.g., coil L1) and analog devices such as the analog scaling circuitry in FIG. 5 and the LC and HC sense A/D inputs of the ADC in the supervisory circuit U3, on a unit-by-unit basis. Briefly, following assembly of the protective circuit interrupter 10 (e.g., an AFCI unit), the internal relay contacts (e.g., K1 and K2) are to be in the open state such that the load side is disconnected from the line side (e.g., the RESET button is in the out or extended position). Under this condition, a manufacturing test of the completed unit 10 can proceed by first connecting a known load (e.g., a 10-Amp RMS resistive load) to the load side of the unit 10, and then wiring the line side hot, neutral, and (if available) ground connections to commercial A/C power. Upon the first power-up of the unit 10, firmware (e.g., separate from or provided in the supervisory circuit U3) performs any applicable wiring tests. Once passed, the firmware performs an evaluation of the Rogowski coil L1 and associated analog circuitry at the front-end of both the LC and HC sense A/D converters. Calibration of the unit 10 for both the amplitude and phase of the sensed line-current can then be initiated following the successful conclusion of the evaluation of the analog front-end circuitry. Evaluation of the analog front-end circuitry involves measuring noise that is capacitively coupled into the Rogowski coil L1 from the line side hot lead or arm K2. An average waveform representative of the 60-Hz noise is determined for both the LC and HC sense A/D converters while the relay contacts are open. The noise reference waveforms are subsequently subtracted from the data collected at the respective A/D inputs. Following this noise compensation process, the data is representative of the actual line-current sensed by the Rogowski coil, and calibration of the measured line current amplitude and phase can be performed against a known load.

For example, evaluation of the analog front-end circuitry begins following the application of commercial A/C power to the unit for the first time. The firmware determines an average cycle of current representative of the capacitive-coupled noise present at both the LC and HC sense A/D converter inputs while the relay contacts are open. A default zero-crossing offset value of 58 is used, and 25-cycles worth of data are collected from which an average cycle representative of the noise is calculated and stored for each A/D input. The average noise cycle calculated for the LC sense A/D input is then correlated against a reference waveform representative of the expected noise. If the result of the correlation meets or exceeds a threshold of 0.976, the Rogowski coil L1 and associated analog circuitry are considered to be working properly and the RESET button is enabled; otherwise, subsequent pressing of the RESET button will not result in latching of the relay contacts.

The amplitude calibration process begins following the RESET button being pressed. If the evaluation of the Rogowski coil L1 and associated analog circuitry was successful, the solenoid L2 fires and latches the relay contacts K1 and K2 in the closed state such that the load side of the unit 10 is connected to the line side and commercial A/C power will be observed at both the load side screw terminals and faceplate outlets. While continuing to use the default zero-crossing offset value of 58 and with the known 10-Amp RMS resistive load connected, the firmware subsequently observes 25-cycles worth of data from the LC sense A/D input and, after compensating for the capacitive coupled noise, calculates an average cycle representative of the load current. The RMS value of this average load current cycle is then determined and compared against the expected RMS value for the known 10-Amp RMS load. If the measured value is within +/−10% of the expected value, the measured value is stored as the amplitude calibration factor to be used for the low-current sense A/D input. The solenoid is otherwise fired in order to disconnect the load-side from the line-side as there is either a problem in the analog circuitry, or the known load is not within a range of 10-Amp RMS+/−10%. Should this occur, the RESET button may be pressed again in order to repeat the amplitude calibration until such time as the amplitude calibration factor is successfully determined. Amplitude calibration of the HC sense A/D input is carried out in the same manner, and at the same time, as the LC sense amplitude calibration.

Following the successful determination of the amplitude calibration factor, calibration of the phase of the line-current measurements is performed. Control over the phase of the line-current measurements relative to the detected falling-edge zero-crossings in the line-voltage is achieved through manipulation of the zero-crossing offset parameter. The zero-crossing offset value represents the number of A/D sampling intervals that are used to delay the identification of the start of a 60-Hz cycle of current following the occurrence of an interrupt generated by the line-voltage zero-crossing detector circuit. The nominal delay between a line-voltage zero-crossing detector circuit interrupt and the actual zero-crossing in the line-voltage is expected to be approximately 1.21-ms, corresponding to the default zero-crossing offset value of 58 A/D sampling intervals at the 48-kSamples/sec rate.

During the phase calibration process, the zero-crossing offset is varied over a range of values from 46 through 76 in steps of one. At each offset value, 25-cycles worth of data are collected from the LC sense A/D input and, after compensating for the capacitive coupled noise, an average cycle representative of the line-current produced by the known resistive load is calculated. This average cycle is subsequently correlated against a reference waveform representative of the expected line-current produced by a resistive load. The zero-crossing offset value for which the correlation result is maximized is stored as the phase calibration zero-crossing offset.

During the phase calibration process, noise compensation of the data is carried out using the average cycle representative of the noise obtained with the zero-crossing offset set at the nominal value of 58. This is done in order to avoid having an operator manually cycle the TEST and RESET buttons for each of the zero-crossing offset values in the evaluation range, which would substantially increase the time required to perform the manufacturing test and calibration procedure. Simulations show that the effect of using the fixed noise compensation cycle rather than computing a new one for each offset value is negligible. The maximum error in the correlation result is expected to be less than 0.001, occurring at the first and last points of the zero-crossing offset range of 46 to 76. The signal presented to the LC sense A/D input is derived from the signal presented to the HC sense A/D input using an inverting amplifier gain stage. The magnitude of the signal presented to the LC sense A/D input is approximately 16.943 times that of the signal as presented to the HC sense A/D input. The amplitude calibration factor for the HC A/D input is expected to be within 10% of the amplitude calibration factor for the LC A/D input divided by 16.943.

In accordance with an advantageous aspect of illustrative embodiments of the present invention, processing sampled current-data on the falling-edge zero-crossings in the line-voltage allows the trip-time response to be optimized due to the manner in which relay coil L2 is controlled. This is important due to the trip-time restrictions imposed by UL1699 Table 40.1, particularly at the higher test currents. Referring to FIG. 5, solenoid L2 can only be energized by the relay control circuit 56 during the positive half-cycles of the line-voltage (Line Hot relative to Line Neutral) due to the presence of diode CR9 as shown. The control signal that enables solenoid L2 to be energized is asserted by the supervisory circuit U3 for 12-ms; this ensures that regardless of when during the cycle that the control signal is asserted, it will remain asserted long enough for the relay control circuit 56 to energize solenoid L2 during the positive half-cycle of the line-voltage. Processing of the sampled data representing a full cycle of the monitored current is initiated at the start of the next subsequent cycle of the line-voltage and completed within one-half cycle (e.g., 8.33-ms). Once the most recent cycle of data is processed, a decision can be made as to whether or not solenoid L2 should be energized as the result of having detected an arc-fault. If data processing then begins on the rising-edge zero-crossings in the line-voltage, it will complete during the negative half-cycle, thereby resulting in a delay of up-to one half-cycle (8.33-ms) before solenoid L2 can be energized to open relay contacts K1 and K2. On the other hand, if data processing begins on the falling-edge zero-crossings, it will complete during the positive half-cycle of the line-voltage, thereby allowing solenoid L2 to be energized immediately upon assertion of the control signal by supervisory circuit U3. Thus, processing of the data from the falling-edge zero-crossings instead of the rising-edge zero-crossings advantageously optimizes trip-time response to the detection of an arc-fault.

Illustrative embodiments of the present invention have been described with reference to operations at a programmable device such as a computerized supervisory circuit in a protective circuit interrupter. It is to be understood, however, that illustrative embodiments of the present invention can also be embodied as computer-readable codes on a computer-readable recording medium. The computer-readable recording medium is any data storage device that can store data which can thereafter be read by a computer system. Examples of the computer-readable recording medium include, but are not limited to, read-only memory (ROM), random-access memory (RAM), CD-ROMs, DVDs, magnetic tapes, floppy disks, optical data storage devices. It is envisioned that aspects of the present invention can be embodied as carrier waves (such as data transmission through the Internet via wired or wireless transmission paths). The computer-readable recording medium can also be distributed over network-coupled computer systems so that the computer-readable code is stored and executed in a distributed fashion.

The components of the illustrative apparatuses and methods employed in accordance with the illustrated embodiments of the present invention can be implemented, at least in part, in digital electronic circuitry, analog electronic circuitry, or in computer hardware, firmware, software, or in combinations of them. These components can be implemented, for example, as a computer program product such as a computer program, program code or computer instructions tangibly embodied in an information carrier, or in a machine-readable storage device, for execution by, or to control the operation of, data processing apparatus such as a programmable processor or computer. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network. Also, functional programs, codes, and code segments for accomplishing the present invention can be easily construed as within the scope of the invention by programmers skilled in the art to which the present invention pertains. Method steps associated with the illustrative embodiments of the present invention can be performed by one or more programmable processors executing a computer program, code or instructions to perform functions (e.g., by operating on input data and/or generating an output). Method steps can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example, semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The above-presented description and figures are intended by way of example only and are not intended to limit the present invention in any way except as set forth in the following claims. It is particularly noted that persons skilled in the art can readily combine the various technical aspects of the various elements of the various illustrative embodiments that have been described above in numerous other ways, all of which are considered to be within the scope of the invention.

What is claimed is:

1. A method of self-testing a protection device interrupter comprising:
    monitoring components in the protection device interrupter to determine whether the components are operational during an arrangement chosen from (a) a line hot arm and a line neutral arm of the protection device interrupter being disconnected, respectively, from a load hot arm and a load neutral of the protection device interrupter; and (b) the line hot arm and the line neutral arm of the protection device interrupter being connected, respectively, to the load hot arm and the load neutral of the protection device interrupter and a load connected to the protection device interrupter via the load hot arm and the load neutral is drawing zero current, and
    disabling connection of the line hot arm and the line neutral arm to, respectively, the load hot arm and the load neutral when the monitored components are determined to be operational during either of the arrangement (a) and the arrangement (b);
    wherein the monitoring comprises monitoring a characteristic associated with at least a selected one of the components in the protection device interrupter chosen from a coil, analog signal conditioning circuitry, and an analog to digital input of a digital processor in the protection device interrupter.

2. The method of claim 1, wherein the monitoring a characteristic comprises using a noise signal associated with the components during the arrangement; and the disabling connection of the line hot arm and the line neutral arm to, respectively, the load hot arm and the load neutral is performed when the noise signal meets a first designated criterion.

3. The method of claim 1, wherein the monitoring comprises:
capacitively coupling at least one of the line hot arm and the line neutral arm in the protection device interrupter to a current sensing coil.

4. The method of claim 3, wherein the current sensing coil is a Rogowski coil.

5. The method of claim 1, further comprising capacitively coupling at least one of a line hot arm and a line neutral arm in the protection device interrupter to a current sensing coil; wherein the monitoring comprises using a noise signal created by the capacitively coupling.

6. The method of claim 5, further comprising:
analyzing the noise signal created by the capacitively coupling; and
disabling connection of the line hot arm and the line neutral arm to, respectively, the load hot arm and the load neutral when the noise signal meets a first designated criterion with respect to the reference noise data.

7. The method of claim 6, further comprising:
analyzing a current signal from the coil when the line hot arm and the line neutral arm are connected, respectively, to the load hot arm and the load neutral; and
disconnecting line hot arm and the line neutral arm, respectively, from the load hot arm and the load neutral when the current signal satisfies a second designated criterion with respect to the reference noise data.

8. The method of claim 7, further comprising:
averaging cycles of the noise signal while the line hot arm and the line neutral arm, respectively, are disconnected from the load hot arm and the load neutral to determine a reference noise cycle and a threshold represented by a root mean square value of the reference noise cycle;
wherein the second designated criterion corresponds to the threshold, and the disconnecting comprises disconnecting the line hot arm and the line neutral arm, respectively, from the load hot arm and the load neutral when the current signal is less than the threshold or greater than the threshold by a selected amount.

9. The method of claim 6, wherein the monitoring further comprises:
averaging cycles of the noise signal to determine a reference noise cycle and a threshold represented by a root mean square value of the reference noise cycle; and
correlating the noise signal with the reference noise cycle, the first designated criterion corresponds to a selected threshold of correlation, and the disabling is performed when the correlating results in correlation below the selected threshold.

10. The method of claim 9, wherein the selected threshold of correlation is 0.976.

11. The method of claim 5, further comprising disposing the other one of the line hot arm and the line neutral arm relative to the coil to create current flow in the same direction through each of the line hot arm and the line neutral arm to reinforce an observed current signal.

* * * * *